United States Patent [19]
Winker et al.

[11] Patent Number: 5,504,603
[45] Date of Patent: Apr. 2, 1996

[54] OPTICAL COMPENSATOR FOR IMPROVED GRAY SCALE PERFORMANCE IN LIQUID CRYSTAL DISPLAY

[75] Inventors: Bruce K. Winker, Moorpark; William J. Gunning, III, Newbury Park; Donald B. Taber, Thousand Oaks; Leonard G. Hale, Newbury Park, all of Calif.

[73] Assignee: Rockwell International Corporation, Seal Beach, Calif.

[21] Appl. No.: 223,251

[22] Filed: Apr. 4, 1994

[51] Int. Cl.⁶ .................................................. G02F 1/1335
[52] U.S. Cl. .................................................... 359/73
[58] Field of Search ...................................... 359/73, 53

[56] References Cited

U.S. PATENT DOCUMENTS

| | | | |
|---|---|---|---|
| 4,701,028 | 10/1987 | Clerc | 350/337 |
| 4,889,412 | 12/1989 | Clerc | 350/347 |
| 5,124,824 | 6/1992 | Kozaki | 359/73 |
| 5,194,975 | 3/1993 | Akatsuka | 359/73 |
| 5,196,953 | 3/1993 | Yeh et al. | 359/73 |

FOREIGN PATENT DOCUMENTS

| | | | |
|---|---|---|---|
| 0350383 | 1/1990 | European Pat. Off. | G02F 1/133 |
| 63-239421 | 10/1988 | Japan | 359/73 |
| 3-028822 | 2/1991 | Japan | G02F 1/133 |
| 3-114023 | 5/1991 | Japan | G02F 1/13 |
| 3-257424 | 11/1991 | Japan | 359/73 |
| 4-3018 | 1/1992 | Japan | 359/73 |

OTHER PUBLICATIONS

Clerc, et al., Highly Multiplexed Super Homeotropic LCD, Japan Display '89, p. 188 (1989).
Clerc, Vertically Aligned Liquid–Crystal Displays, SID 91 Digest, p. 758 (Society for Information Display 1991).
Motohiro, et al., Thin film retardation plate by oblique deposition, Applied Optics, vol. 28, p. 2466 (Jul. 1, 1989).
Yamamoto, et al., Full–cone Wide–Viewing–Angle Multi-color CSH–LCD, SID 91 Digest, p. 762 (Society for Information 1991).

*Primary Examiner*—Anita Pellman Gross
*Assistant Examiner*—James A. Dudek
*Attorney, Agent, or Firm*—John J. Deinken

[57] ABSTRACT

A liquid crystal display for viewing at various angles with respect to a normal axis perpendicular to the display includes a polarizer layer having an absorbing axis, an analyzer layer having an absorbing axis substantially perpendicular to the absorbing axis of the polarizer layer, a liquid crystal layer disposed between the polarizer layer and the analyzer layer and having a director exhibiting an azimuthal twist through the layer with respect to the normal axis, a first electrode proximate to a first major surface of the liquid crystal layer, a second electrode proximate to a second major surface of the liquid crystal layer, the first and second electrodes being adapted to apply a voltage across the liquid crystal layer when the electrodes are connected to a source of electrical potential, and a compensator, including a positively birefringent O-plate compensator layer disposed between the polarizer layer and the analyzer layer with its principal symmetry axis oriented at a substantially oblique angle with respect to the normal axis.

12 Claims, 19 Drawing Sheets

Polarizer
Transmission axis @ ϕ = 133°

A-plate
ϕ = 137°
θ = 0°

O-plate
ϕ = -135°
θ = 50°

C-plate
θ = 90°

Liquid Crystal layer
Rear Rub @ ϕ = 135°
Front Rub @ ϕ = -135°

C-plate
θ = 90°

O-plate
ϕ = -45°
θ = 50°

Analyzer
Transmission axis @ ϕ = 45°

Polarizer
Transmission axis @ $\phi = 134°$

A-plate
$\phi = 133°$
$\theta = 0°$

O-plate
$\phi = -20°$
$\theta = 38°$

O-plate
$\phi = -160°$
$\theta = 38°$

A-plate
$\phi = 176°$
$\theta = 0°$

Liquid Crystal layer
Rear Rub @ $\phi = 135°$
Front Rub @ $\phi = -135°$

Analyzer
Transmission axis @ $\phi = 45°$

OPTICAL COMPENSATOR FOR IMPROVED GRAY SCALE PERFORMANCE IN LIQUID CRYSTAL DISPLAY

BACKGROUND OF THE INVENTION

This invention is concerned with the design of liquid crystal displays and particularly with techniques for maximizing the field of view of such displays by maintaining a high contrast ratio and minimal variance in relative gray levels over a wide range of viewing angles.

Liquid crystals are useful for electronic displays because polarized light traveling through a liquid crystal layer is affected by the layer's birefringence, which can be changed by the application of a voltage across the layer. By using this effect, the transmission or reflection of light from an external source, including ambient light, can be controlled with much less power than is required for the luminescent materials used in other types of displays. As a result, liquid crystal displays are now commonly used in a wide variety of applications, such as, for example, digital watches, calculators, portable computers, and many other types of electronic equipment, exhibiting in these applications the advantages of very long life and operation with very low weight and low power consumption.

The information content in many liquid crystal displays is presented in the form of multiple rows of numerals or characters, which are generated by segmented electrodes deposited in a pattern on the display. The electrode segments are connected by individual leads to electronic driving circuitry, which causes the desired information to be displayed by applying a voltage to the appropriate combination of segments, thereby controlling the light transmitted through the segments. Graphic and television displays may be achieved by employing a matrix of pixels in the display which are connected by an X–Y sequential addressing scheme between two sets of perpendicular conductors. More advanced addressing schemes, applied predominantly to twisted nematic liquid crystal displays, use arrays of thin film transistors to control driving voltages at the individual pixels.

Contrast and stability of relative gray scale intensities are important attributes in determining the quality of a liquid crystal display. The primary factor limiting the contrast achievable in a liquid crystal display is the amount of light which leaks through the display in the dark state. In addition, the contrast ratio of the liquid crystal device also depends on the viewing angle. The contrast ratio in a typical liquid crystal display is a maximum only within a narrow viewing angle centered about normal incidence and drops off as the angle of view is increased. This loss of contrast ratio is caused by light leaking through the black state pixel elements at large viewing angles. In color liquid crystal displays, such leakage also causes severe color shifts for both saturated and gray scale colors. The viewing zone of acceptable gray scale stability in a typical prior art twisted nematic liquid crystal display is severely limited because, in addition to color shifts caused by dark state leakage, the optical anisotropy of the liquid crystal molecules results in large variations in gray level transmission, i.e., a shift in the brightness-voltage curve, as a function of viewing angle. The variation is severe enough that, at extreme vertical angles, some of the gray levels reverse their transmission levels. These limitations are particularly important for applications requiring a very high quality display, such as avionics, where viewing of cockpit displays from both pilot and copilot seating positions is important. Such high information content displays require that the relative gray level transmission be as invariant as possible with respect to viewing angle. It would be a significant improvement in the art to provide a liquid crystal display capable of presenting a high quality, high contrast image over a wide field of view.

SUMMARY OF THE INVENTION

The compensator design of this invention, which includes a positively birefringent O-plate layer with a special orientation, makes possible a significant improvement in the gray scale properties and contrast ratios of liquid crystal displays over a wide range of viewing angles. A liquid crystal display for viewing at various angles with respect to a normal axis perpendicular to the display includes a polarizer layer having an absorbing axis, an analyzer layer having an absorbing axis substantially perpendicular to the absorbing axis of the polarizer layer, a liquid crystal layer disposed between the polarizer layer and the analyzer layer and having a director exhibiting an azimuthal twist through the layer with respect to the normal axis, a first electrode proximate to a first major surface of the liquid crystal layer, a second electrode proximate to a second major surface of the liquid crystal layer, the first and second electrodes being adapted to apply a voltage across the liquid crystal layer when the electrodes are connected to a source of electrical potential, and a compensator, including a positively birefringent O-plate compensator layer disposed between the polarizer layer and the analyzer layer with its principal symmetry axis oriented at a substantially oblique angle with respect to the normal axis.

In a more particular embodiment, the principal symmetry axis of the O-plate layer is further oriented approximately perpendicular to the orientation of the average liquid crystal director in the central region of the liquid crystal layer at a voltage in the gray scale transition region of the BV curve for the liquid crystal layer.

In an alternative embodiment, the principal symmetry axis of the O-plate layer is further oriented at an angle with respect to the normal axis that is approximately equal to the orientation angle with respect to the normal axis of the average liquid crystal director in the central region of the liquid crystal layer at a voltage in the gray scale transition region of the BV curve for the liquid crystal layer and wherein the azimuthal orientation of the principal symmetry axis of the O-plate layer about the normal axis is rotated approximately 180° with respect to the azimuthal orientation of the average liquid crystal director.

The compensator may also include one or more positively birefringent A-plate compensator layers, each A-plate layer being oriented with its optic axis relative to the optic axis of an O-plate layer such that retardation of light passing through the compensator at normal incidence is minimized.

In addition, one or more negatively birefringent C-plate compensator layers may be added to the compensator.

The O-plate layer may be joined by a second positively birefringent O-plate compensator layer with its optic axis oriented at a substantially oblique angle with respect to the normal axis and such that the azimuth angles of the first and second O-plate layers are crossed, the two O-plates thereby constituting crossed O-plates.

DESCRIPTION OF THE INVENTION

Figure 1:
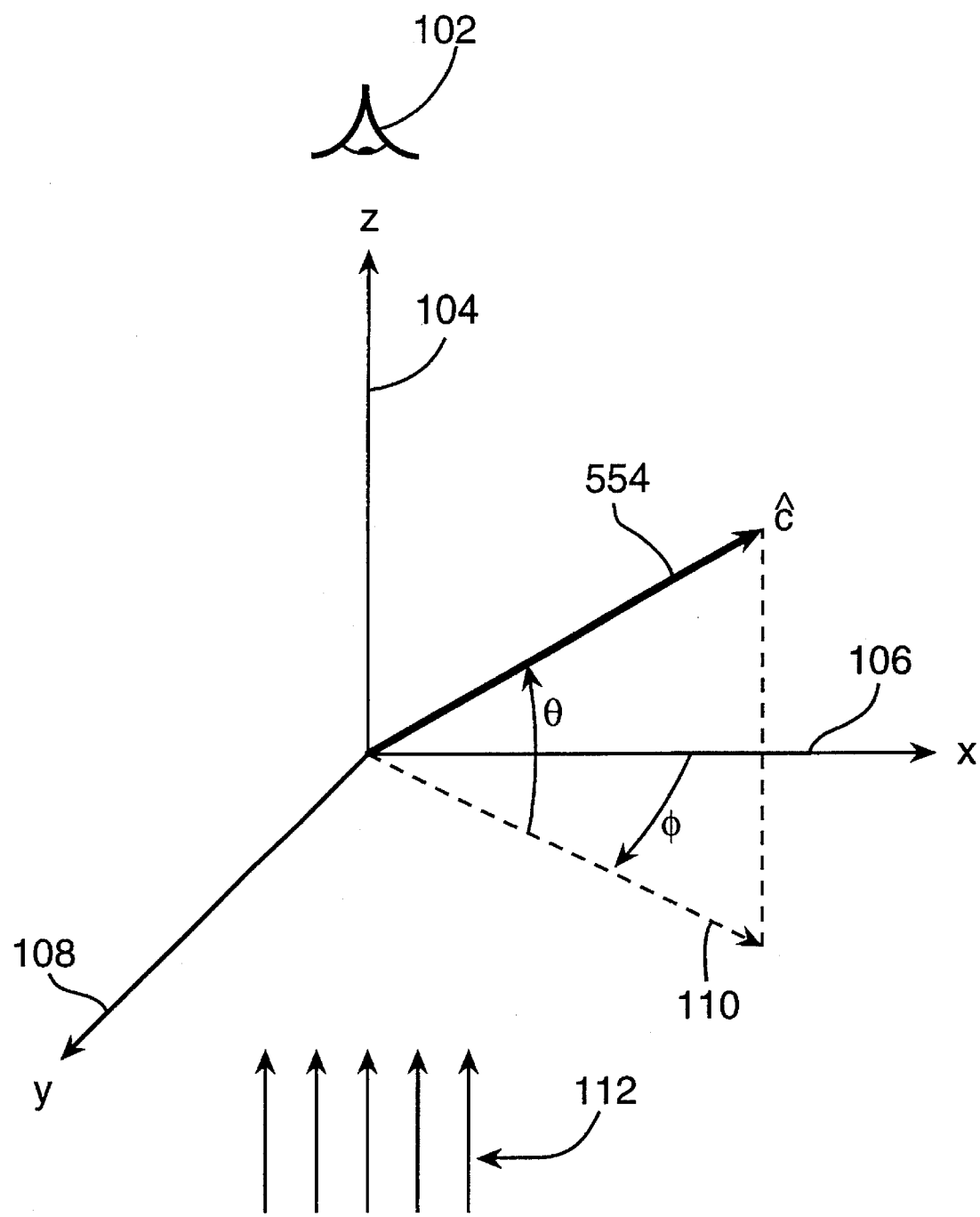
FIG. 1 depicts the coordinate system that is used to specify component orientations in the description of this invention.

When viewed directly a twisted nematic liquid crystal display provides high quality output, but at large viewing angles the image tends to degrade and exhibit poor contrast and gray scale nonuniformity. This occurs because the phase retardation effect of the liquid crystal material on light passing through it inherently varies with the inclination angle of the light, leading to a lower quality image at large viewing angles. By introducing one or more optical compensating elements in conjunction with the liquid crystal cell, however, it is possible to substantially correct for the undesirable angular effects and thereby maintain higher contrast and stable relative gray scale intensities at larger viewing angles than otherwise possible.

In a "normally white" display configuration, the 90° twisted nematic cell is placed between polarizers which are crossed, such that the transmission axis of each polarizer is either parallel or perpendicular to the director orientation of the liquid crystal molecules in the region of the cell adjacent to that polarizer. The "nonselect" (no applied voltage) areas appear light in a normally white display, while "select" areas (those which are energized by an applied voltage) appear dark. In the select areas the liquid crystal molecules tend to tilt and rotate toward alignment with the applied electric field. If this alignment were perfectly homeotropic, all the liquid crystal molecules in the cell would be oriented with their long axes normal to the substrate glass. Because the liquid crystals used for twisted nematic displays exhibit positive birefringence, this arrangement, known as the homeotropic configuration, would exhibit the optical symmetry of a positively birefringent C-plate. A C-plate is a uniaxial birefringent plate with its extraordinary axis (i.e., its optic or c-axis) perpendicular to the surface of the plate (parallel to the direction of normally incident light). In the select state the liquid crystal in a normally white display would thus appear isotropic to normally incident light, which would be blocked by the crossed polarizers.

One reason for the loss of contrast with increased viewing angle which occurs in a normally white display is that a homeotropic liquid crystal layer will not appear isotropic to off-normal light. Light propagating through the layer at off-normal angles appears in two modes due to the birefringence of the layer; a phase delay is introduced between those modes and increases with the incident angle of the light. This phase dependence on incidence angle introduces an ellipticity to the polarization state which is incompletely extinguished by the second polarizer, giving rise to light leakage. To correct for this effect, an optical compensating element must also have C-plate symmetry, but with negative ($n_e < n_o$) birefringence. Such a compensator will introduce a phase delay opposite in sign to the phase delay caused by the liquid crystal layer, thereby restoring the original polarization state and allowing light passing through energized areas of the layer to be blocked more completely by the output polarizer. C-plate compensation, however, does not impact the variation of gray scale with viewing angle, which is addressed by the present invention.

FIG. 1 depicts the coordinate system which is used to describe the orientation of both liquid crystal and birefringent compensator optic axes. Light propagates toward the viewer 102 in the positive z direction 104 which, together with the x-axis 106 and the y-axis 108, form a right-handed coordinate system. Backlighting is provided, as indicated by the arrows 112, from the negative z direction. The polar or tilt angle (θ) is defined as the angle between the molecular optic axis ĉ and the x–y plane, measured from the x–y plane.

The azimuthal or twist angle (Φ) is measured from the x-axis to the projection 110 of the optic axis into the x-y plane.

Figure 2:
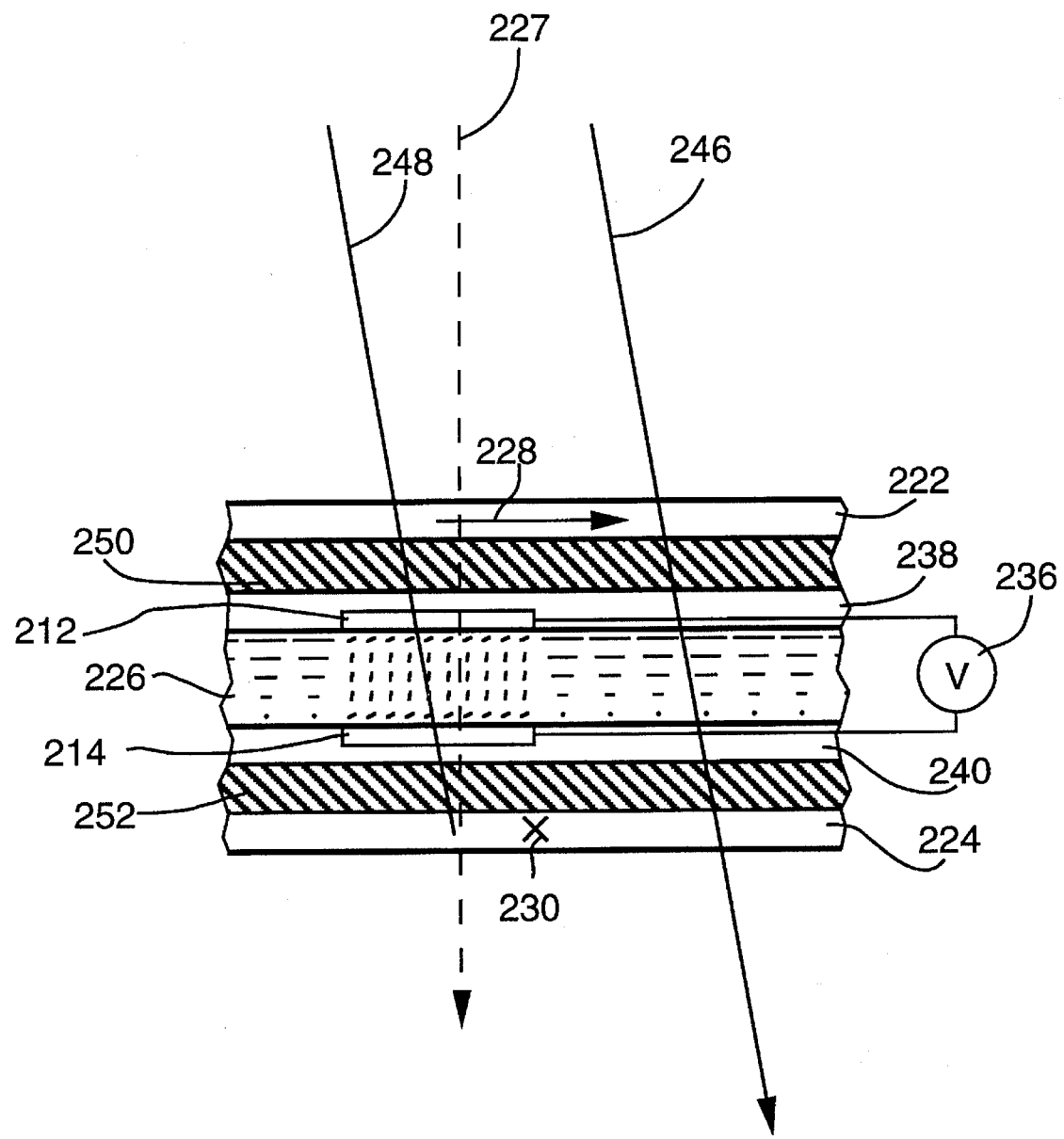
FIG. 2 is a cross sectional schematic side view of a 90° twisted nematic, transmissive type normally white liquid crystal display (LCD) constructed according to this invention.

FIG. 2 is a cross sectional schematic side view of a twisted nematic, transmissive type normally white liquid crystal display (LCD) constructed according to this invention. The display includes a polarizer layer 222 and an analyzer layer 224, between which is positioned a liquid crystal layer 226, consisting of a liquid crystal material in the nematic phase. It is convenient in describing the compensation elements of this invention to refer to a normal axis perpendicular to the display, which is depicted by a dashed line 227. The polarizer and the analyzer, as is indicated by the symbols 228 (representing a polarization direction in the plane of the drawing) and 230 (representing a polarization direction orthogonal to the plane of the drawing), are oriented with their polarization directions at 90° to one another, as is the case for a normally white display. A first transparent electrode 212 and a second transparent electrode 214 are positioned adjacent to opposite surfaces of the liquid crystal layer so that a voltage can be applied, by means of a voltage source 236, across the liquid crystal layer. The liquid crystal layer is in addition sandwiched between a pair of glass plates 238 and 240. As is explained further below, the inner surfaces of the glass plates 238 and 240, which are proximate to the liquid crystal layer 226, are physically or chemically treated, as by buffing.

As is well known in the LCD art (see, e.g., Kahn, The Molecular Physics of Liquid—Crystal Devices, Physics Today, Page 68 (May 1982)), when the material of the liquid crystal layer 226 is in the nematic phase and the inner surfaces of the plates 238 and 240 (the surfaces adjacent to the layer 226) are coated with a surface treatment for aligning the liquid crystal such as polyimide, buffed, and oriented with their buffed directions perpendicular, the director n of the liquid crystal material, absent any applied electrical voltage, will tend to align with the buffed direction (known as the "rub direction") in the regions of the layer proximate each of the plates 238 and 240. Furthermore, the director will twist smoothly with respect to the normal axis through an angle of 90° along a path in the layer 226 from the first major surface adjacent to the plate 238 to the second major surface adjacent to the plate 240. Consequently, in the absence of an applied electric field the direction of polarization of incoming polarized light will be rotated by 90° in traveling through the liquid crystal layer. When the glass plates and the liquid crystal layer are placed between crossed polarizers, such as the polarizer 228 and the analyzer 230, light polarized by the polarizer 228 and traversing the display, as exemplified by the light ray 246, will thus be aligned with the polarization direction of the analyzer 230 and therefore will pass through the analyzer. When a sufficient voltage is applied to the electrodes 212 and 214, however, the applied electric field causes the director of the liquid crystal material to tend to align parallel to the field. With the liquid crystal material in this state, light passed by the polarizer 228, as illustrated by the light ray 248, will be extinguished by the analyzer 230. Thus an energized pair of electrodes will produce a dark region of the display, while light passing through regions of the display which are not subject to an applied field will produce illuminated regions. As is well known in the LCD display art, an appropriate pattern of electrodes, activated in selected combinations, can be utilized in this manner to display alphanumeric or graphic information. As explained further below, one or more compensator layers, such as the layers 250 and 252, may be included in the display to improve the quality of the display.

Figure 3:
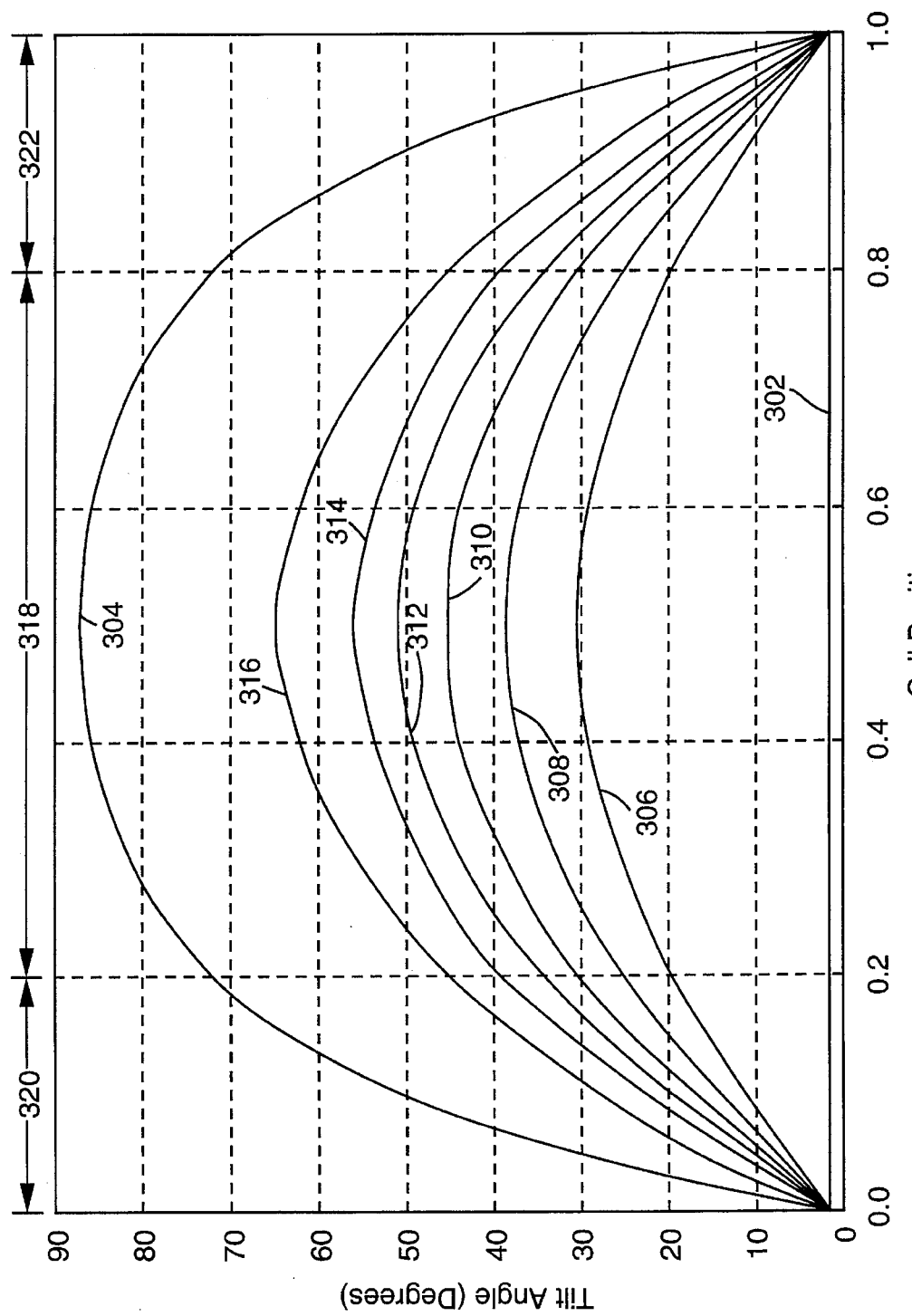
FIG. 3 is a plot of the tilt angle of the director (in degrees along the vertical axis) as a function of position (as a fraction z of depth along the horizontal axis) in a 90° twisted nematic liquid crystal cell.

FIG. 3 is a calculated plot of liquid crystal director tilt as a function of position in the liquid crystal layer (where the cell gap has been normalized to unity) in a 90 degree twisted nematic cell. It illustrates the typical distribution of molecular tilt angles when no voltage is applied (curve 302), under a typical select state voltage (curve 304), and under the application of several intermediate voltages chosen to yield linearly spaced gray levels (curves 306, 308, 310, 312, 314, and 316). Note that the gray level curves are centered about a tilt angle of approximately 45° halfway through the cell.

Figure 4:
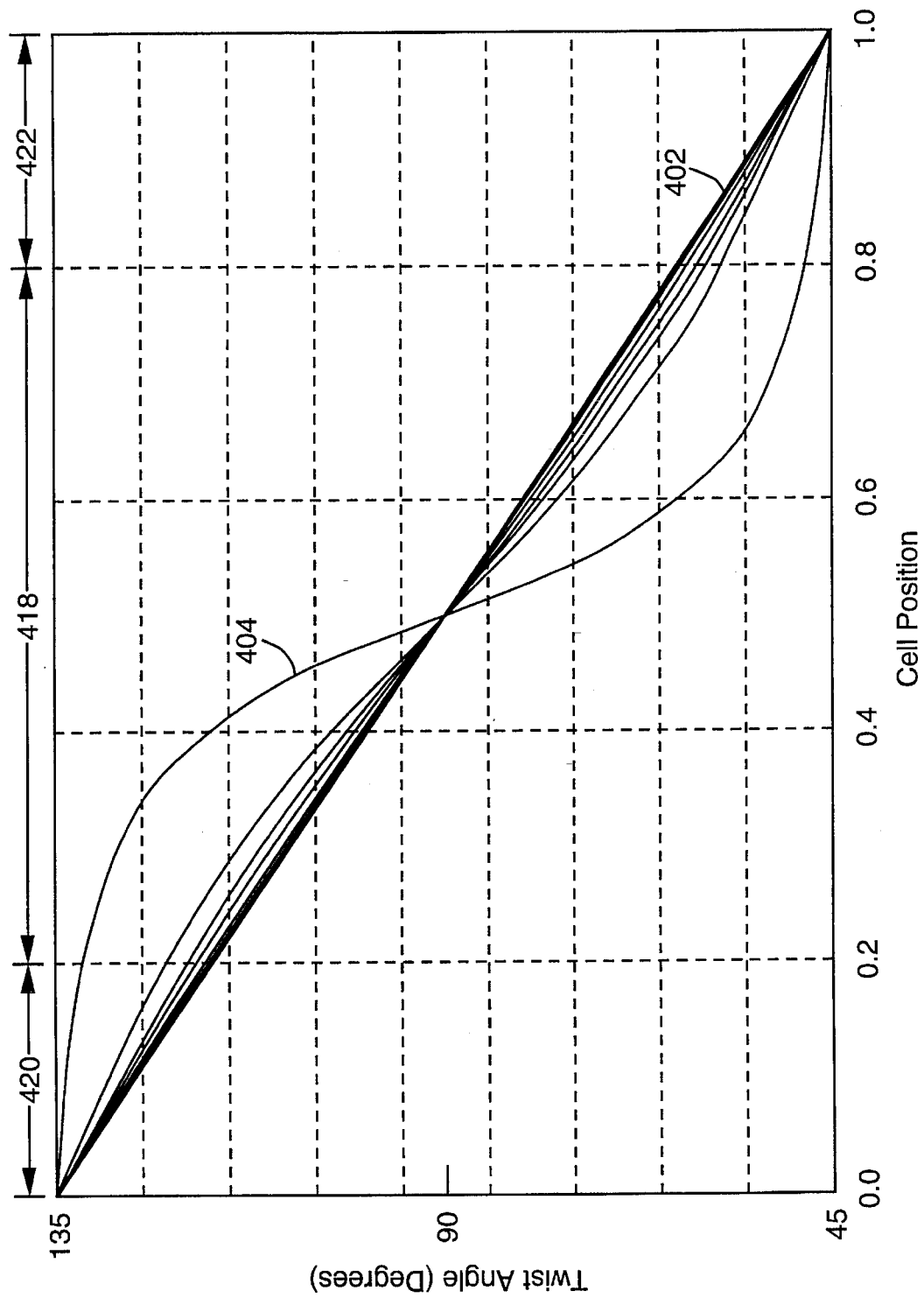
FIG. 4 is a related plot for the same cell depicting the twist angle of the liquid crystal molecules as a function of position in the cell.

FIG. 4 is a related plot for the same cell depicting the calculated twist angle of the liquid crystal molecules as a function of position in the cell. When there is no applied voltage, the twist is distributed evenly throughout the cell (straight line curve 402). Under a fully select state voltage, the twist angles are distributed as shown by the extremal, S-shaped curve 404. The twist distributions for gray levels are shown by the intermediate curves between these two curves.

As illustrated by FIGS. 3 and 4, when the fully selected voltage is applied nearly all of the twist experienced by the liquid crystal molecules, and a substantial portion of the tilt, occurs in the central region of the cell. Because of these phenomena, the continuous variation of molecular orientation within the cell can be separated into three regions, each of which is characterized by its own optical symmetry. Thus the central regions 318 (FIG. 3) and 418 (FIG. 4) can be considered as nominally homeotropic in the fully select state, approximating the properties of a C-plate. The regions 320 and 322 (FIG. 3) and 420 and 422 (FIG. 4), near each surface of the cell, behave as A-plates, each with its extraordinary axis aligned with the rub direction of the proximate substrate. Because there is essentially no twist in the molecules of the regions 320, 322, 420, and 422, these molecules are essentially aligned with the respective rub directions on either side of the liquid crystal layer. In addition, because the twist angle of the molecules in the regions 320 and 420 tends to be perpendicular to the twist angle of the molecules in the regions 322 and 422, the effect of these two regions on light traveling through the cell tends to be canceled, leaving the middle C-plate region to exert the dominant influence.

A negative C-plate compensator is designed to correct for the angle dependent phase shift introduced by propagation through the central, approximately C-plate region. Such a compensator is effective to the extent that the optical symmetry of this region dominates the selected state of the liquid crystal cell, that is, the extent to which the molecules align with the applied field. This implies that negative C-plate compensation will work best when strong fields are used for the energized state as this makes the homeotropic approximation more nearly correct. The use of a C-plate has been demonstrated to significantly reduce the leakage of the dark state over an extended field of view, thus improving contrast and reducing color desaturation.

While the use of the C-plate compensator is important for eliminating color desaturation, the issue of gray scale is independent. The problem of gray scale linearity over the field of view relates entirely to the brightness level changes for levels assigned between the select (black for a normally white display) and nonselect (white for a normally white display) states. Consider the brightness versus voltage (BV) electrooptic response curves for a display to which eight gray levels are assigned, from level 0, the select black state, to level 7, the nonselect white state. Gray levels between 0 and 7 are chosen by assigning them a set of voltages spaced linearly in brightness along the BV curve between the select and nonselect voltages.

Figure 5:
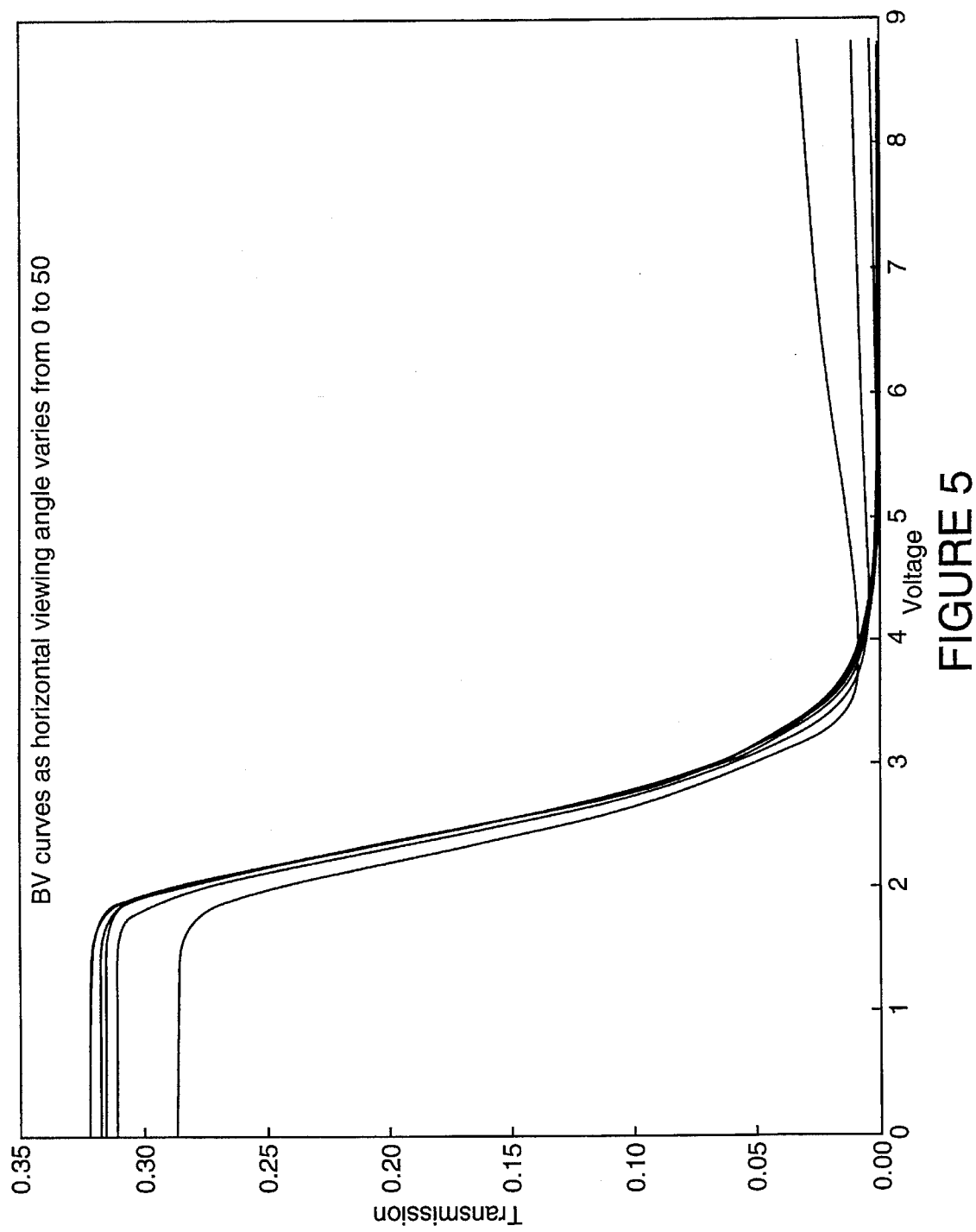
FIG. 5 is a plot of calculated brightness vs. voltage (BV) electrooptic curves at a variety of horizontal viewing directions for a typical twisted nematic display without the benefit of the gray scale improvements provided by this invention.

FIG. 5 is a plot of calculated BV curves for a normally white, 90° twisted nematic display as the horizontal viewing angle varies from zero to 50° in 10° increments while the vertical viewing angle remains fixed at zero. (The change in the BV curves with horizontal angle is independent of whether the horizontal deviation is to the left or right.) Note that the regions of each curve over which gray levels would be selected almost overlie one another for the various horizontal angles. This means that gray levels chosen to be linearly spaced at zero degrees would remain very nearly linear at even high horizontal viewing angles.

Figure 6:
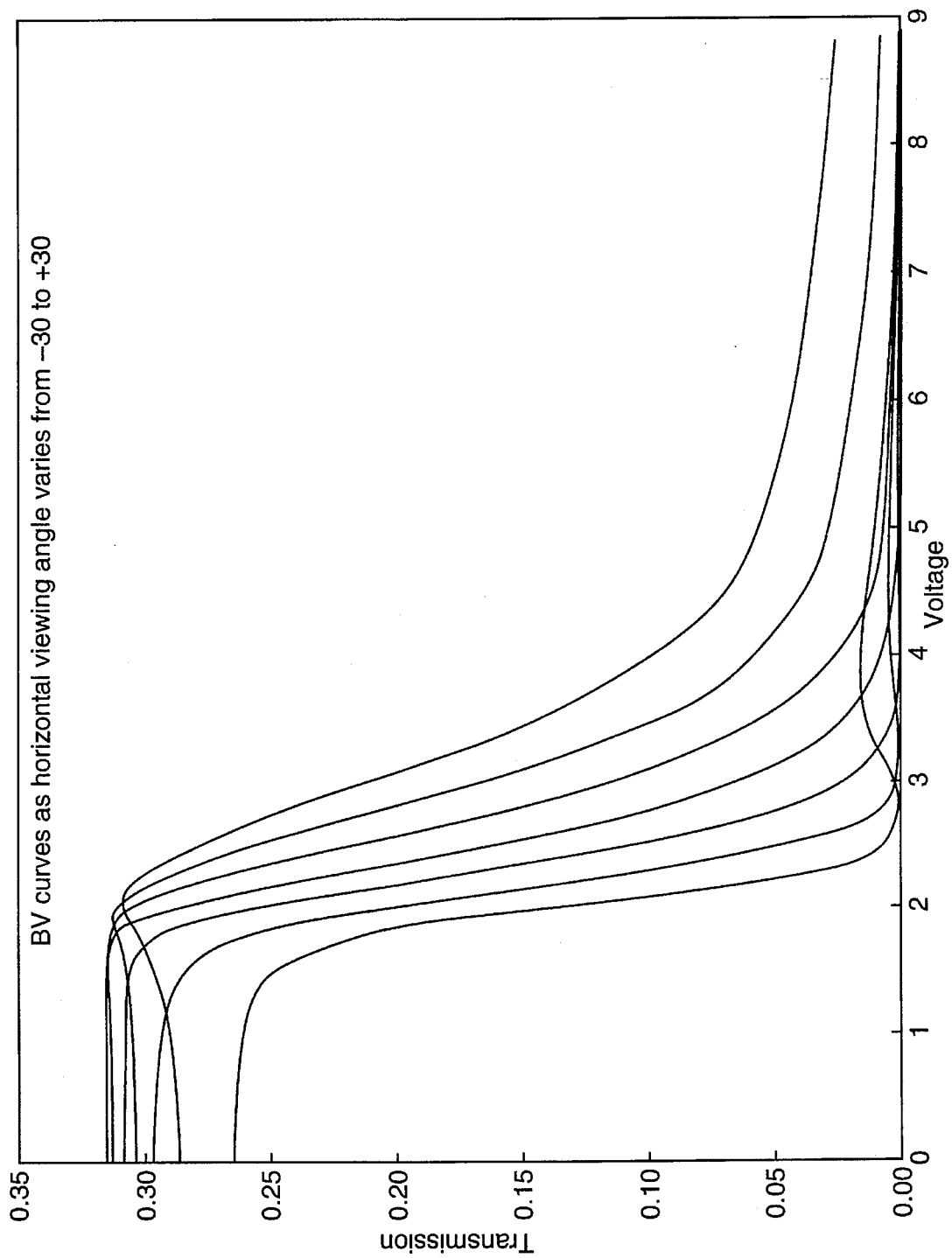
FIG. 6 is a plot of calculated brightness vs. voltage (BV) electrooptic curves at a variety of vertical viewing directions for a typical twisted nematic display without the benefit of the gray scale improvements provided by this invention.

The gray scale linearity problem appears when the vertical viewing angle varies. This is illustrated in FIG. 6, which is a plot of the BV curves for a normally white, 90° twisted nematic display as the vertical viewing angle varies from −30° to +30° while the horizontal viewing angle remains fixed at zero. It can be observed that for angles below 0° (measured from the normal) the BV curves shift to the right (higher voltage), and fall monotonically from their maximum but fail to reach zero.

Figure 7:
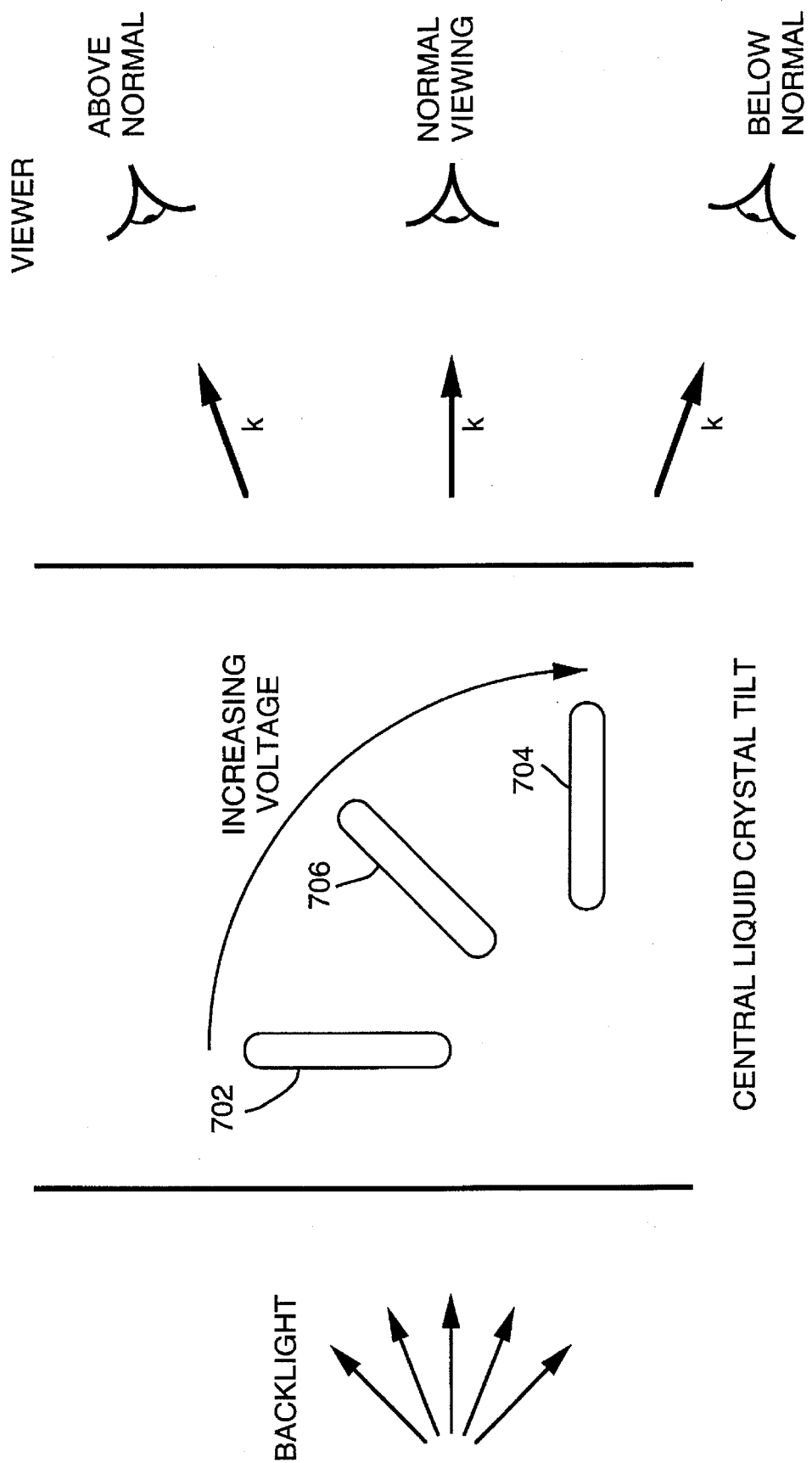
FIG. 7 is an illustration of the viewer's perspective relative to the average director orientation of a liquid crystal.
Figure 8:
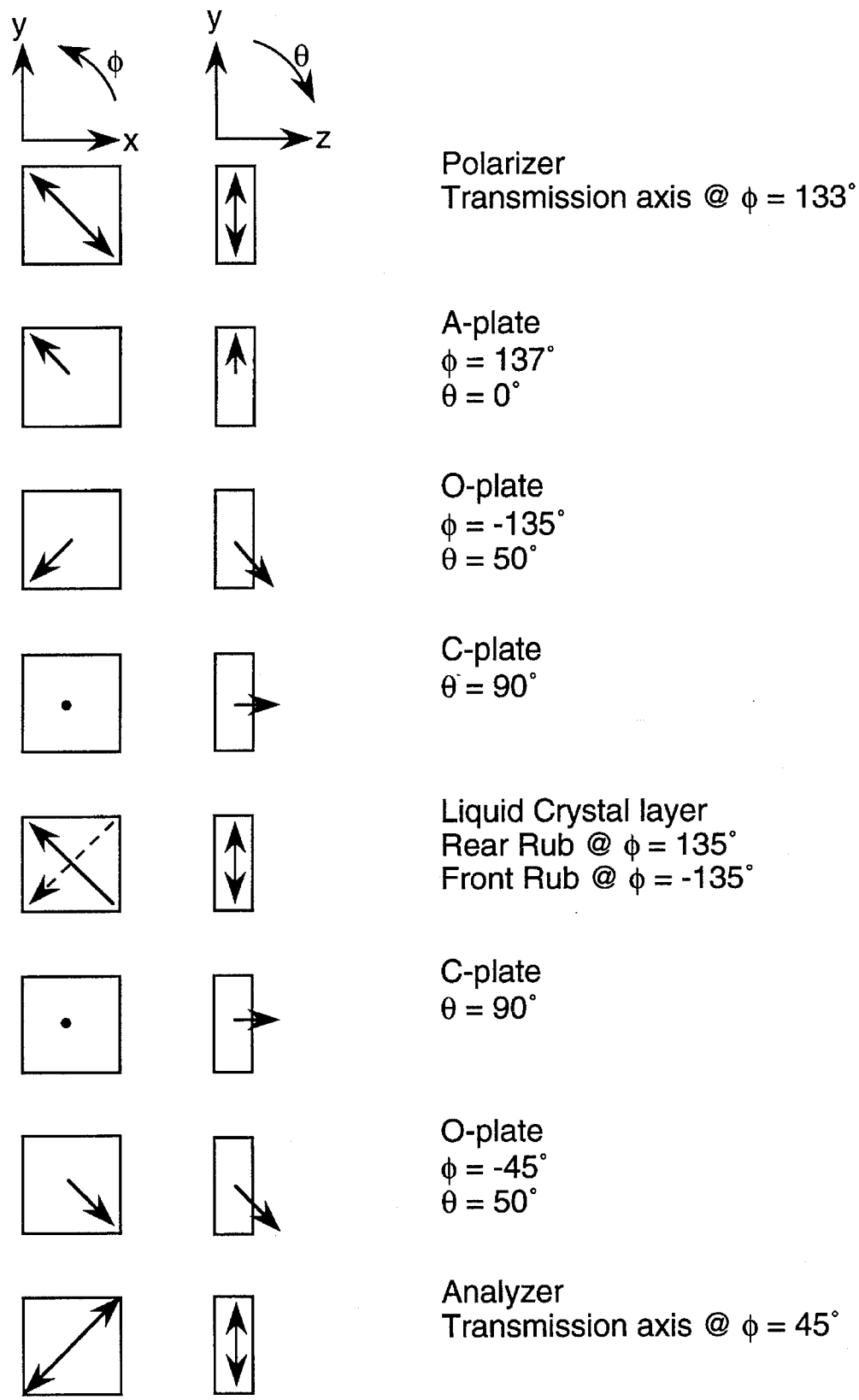
FIG. 8 is a schematic, expanded view of a gray scale compensator with an AOC-LC-CO configuration constructed according to the present invention.
Figure 9:
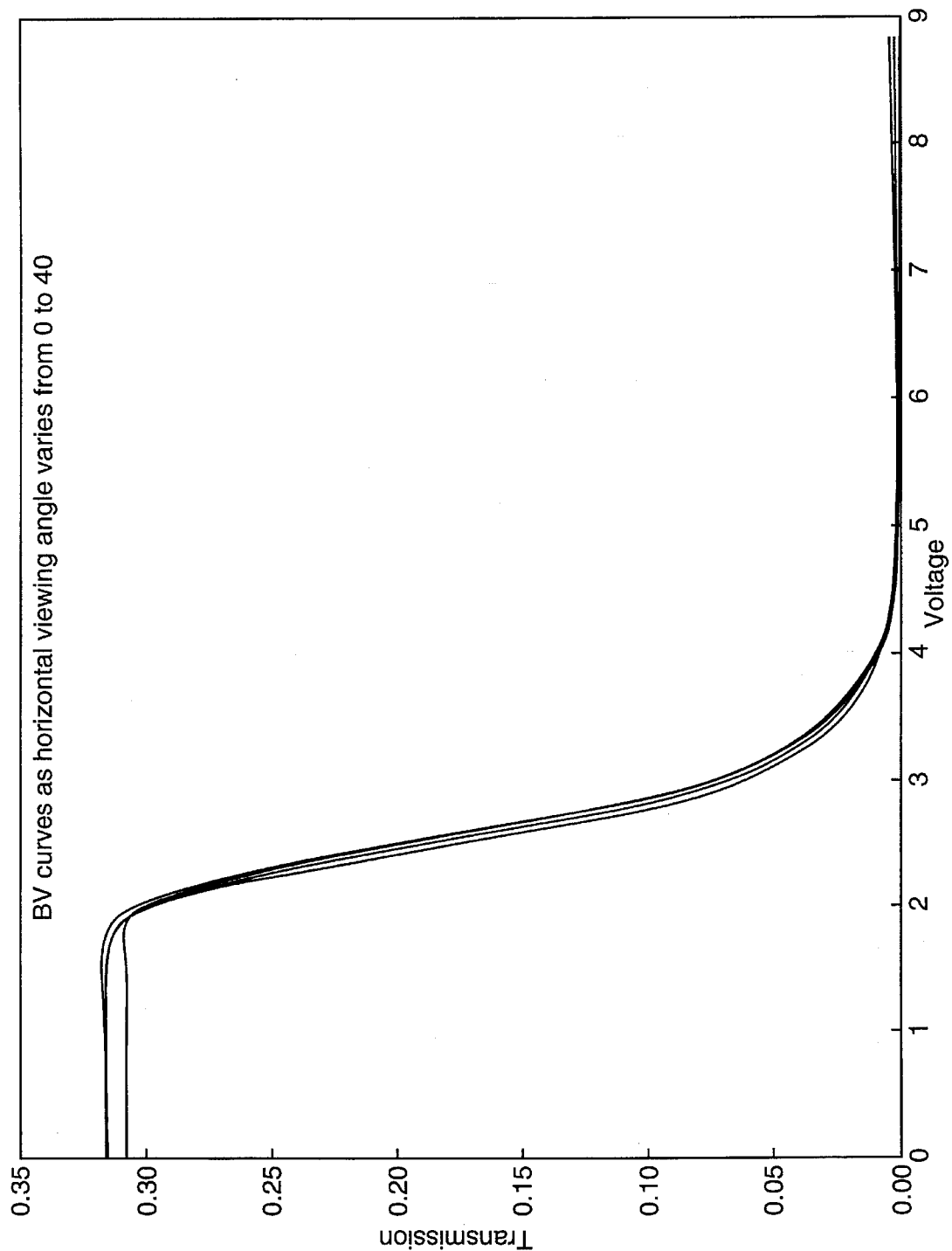
FIG. 9 is a plot of transmitted light as a function of voltage illustrating the BV characteristics at a variety of horizontal viewing angles for the compensator configuration depicted in FIG. 8.
Figure 10:
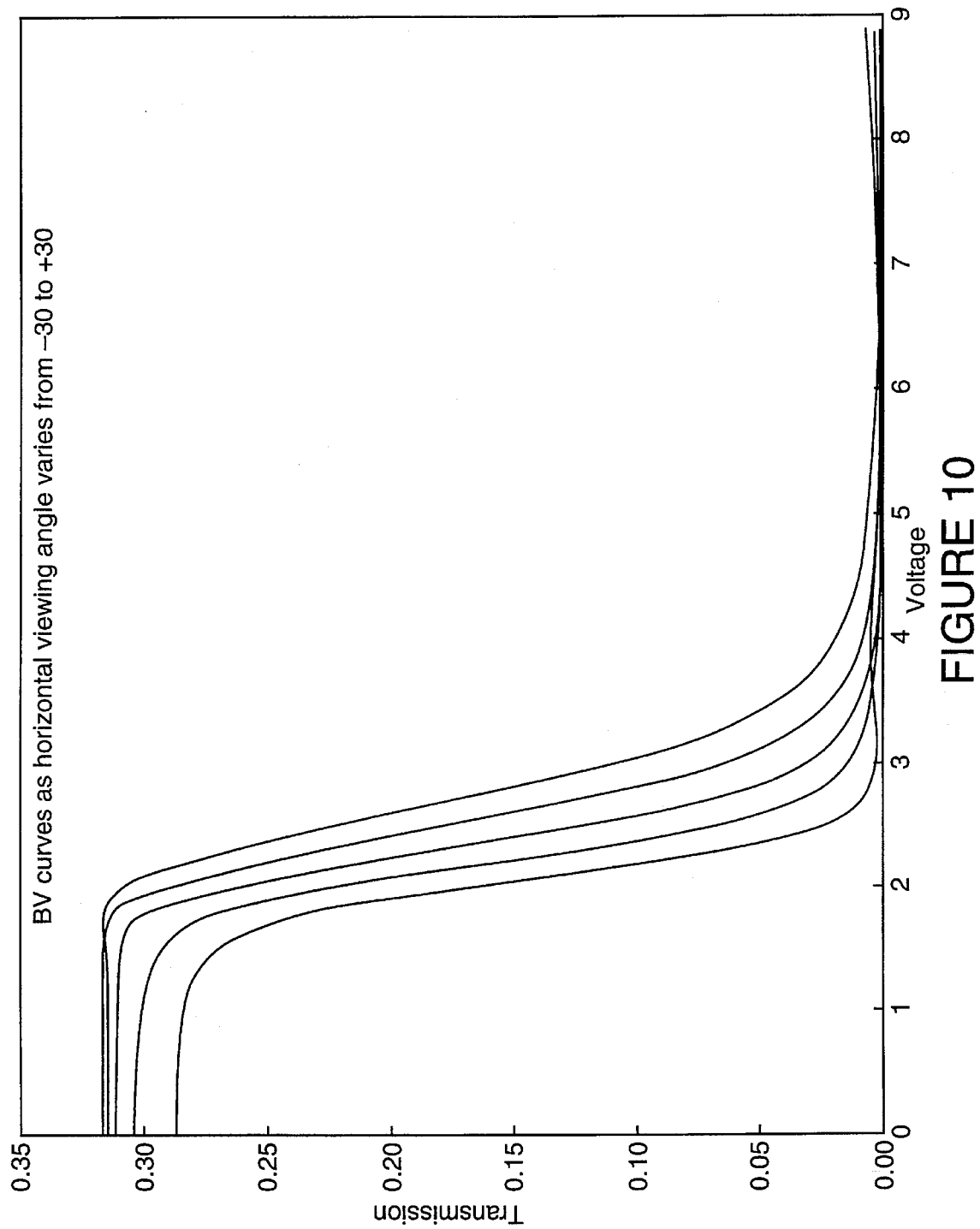
FIG. 10 is a plot of transmitted light as a function of voltage illustrating the BV characteristics at a variety of vertical viewing angles for the compensator configuration depicted in FIG. 8.
Figure 11:
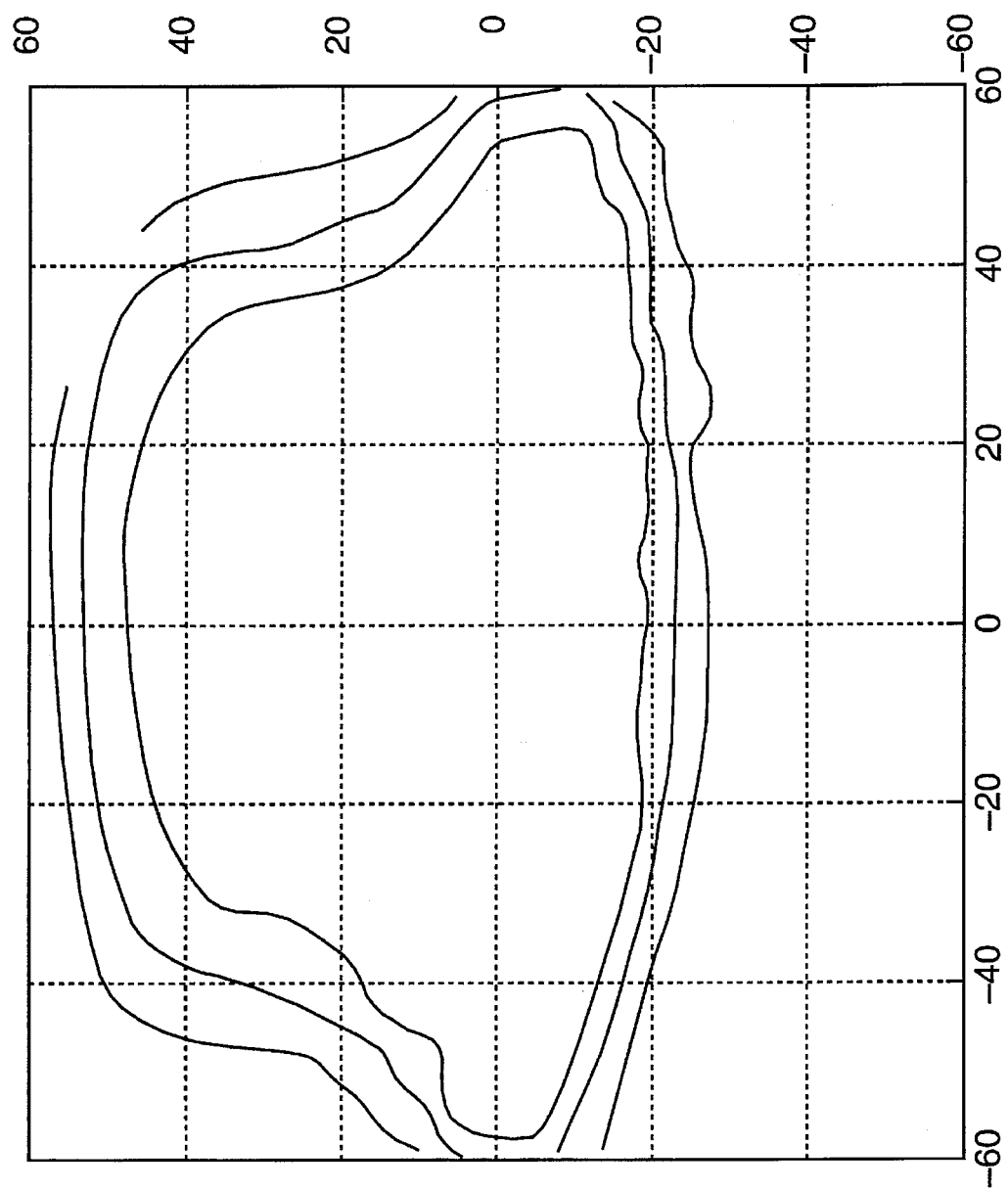
FIG. 11 is a plot as a function of vertical and horizontal viewing angle depicting calculated isocontrast contours for the compensator configuration depicted in FIG. 8.
Figure 12:
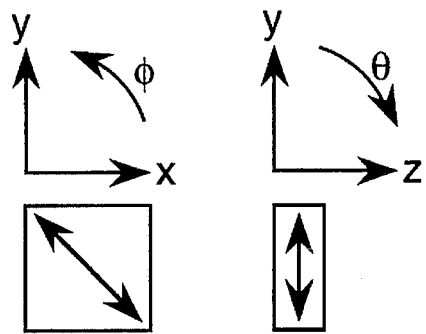
FIG. 12 is a schematic, expanded view of a gray scale compensator with an A-OxO-A-LC configuration constructed according to the present invention.
Figure 12:
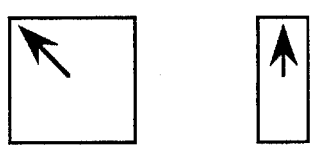
Figure 13:
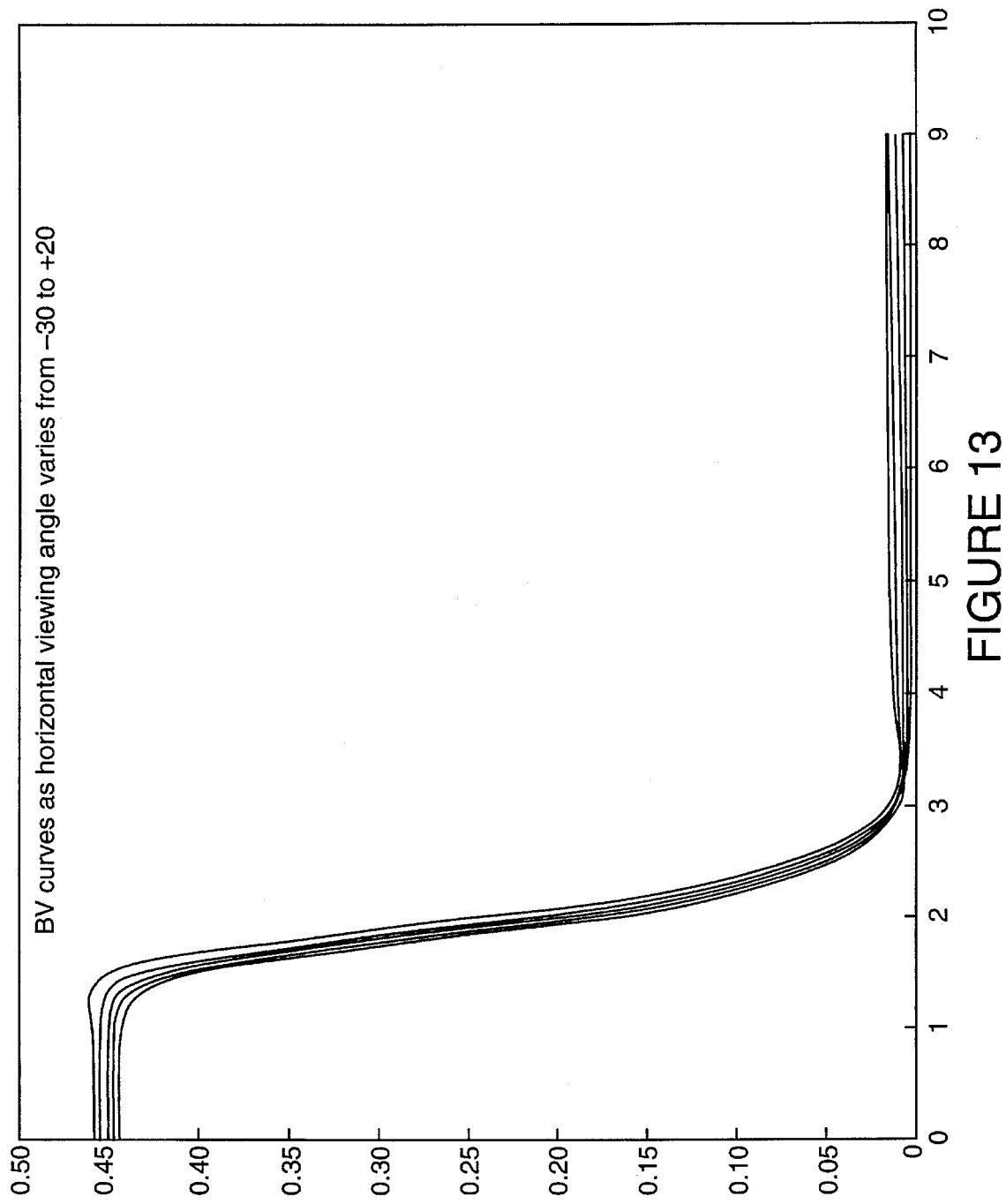
FIG. 13 is a plot of transmitted light as a function of voltage illustrating the BV characteristics at a variety of horizontal viewing angles for the compensator configuration depicted in FIG. 12.
Figure 14:
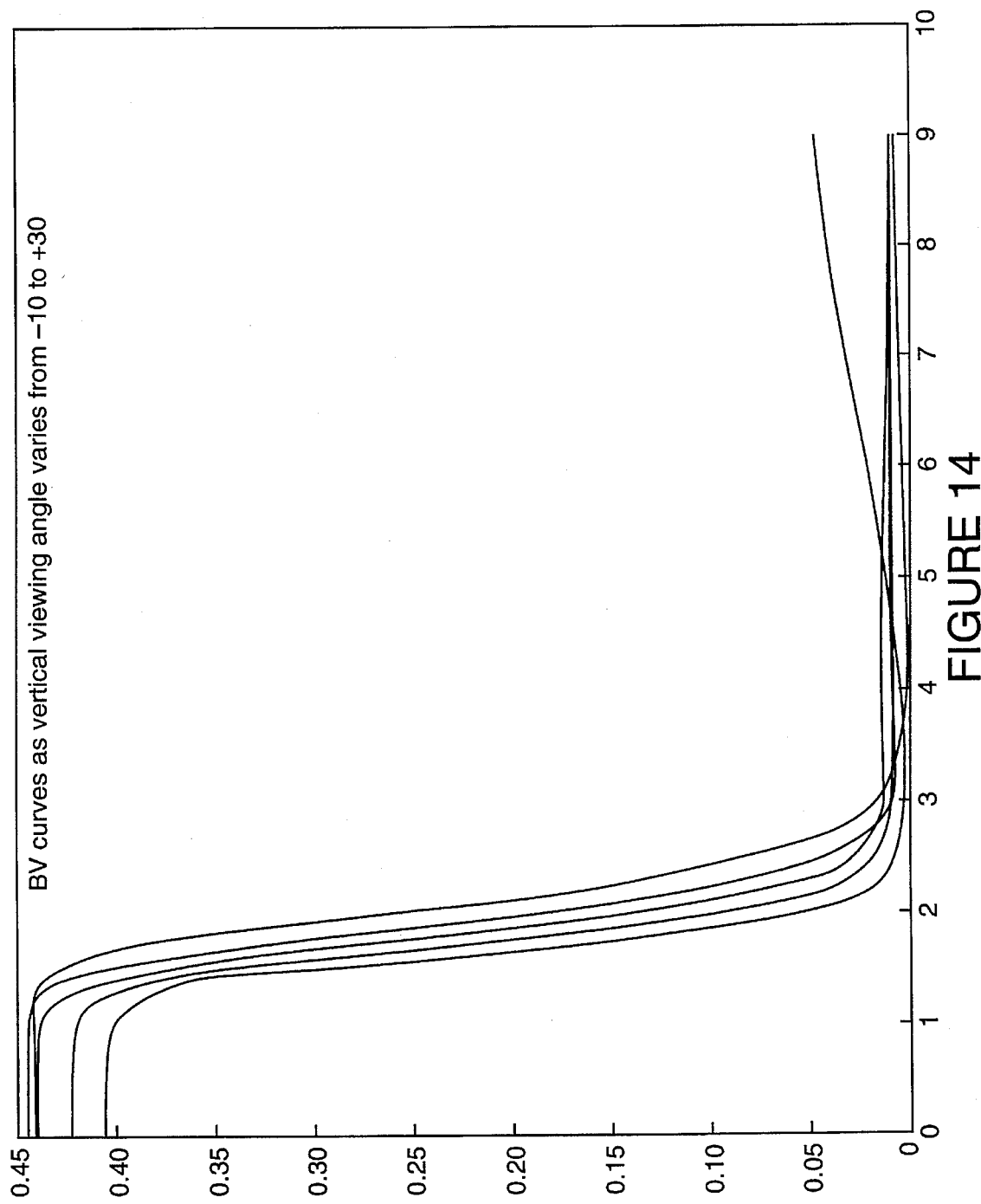
FIG. 14 is a plot of transmitted light as a function of voltage illustrating the BV characteristics at a variety of vertical viewing angles for the compensator configuration depicted in FIG. 12.
Figure 15:
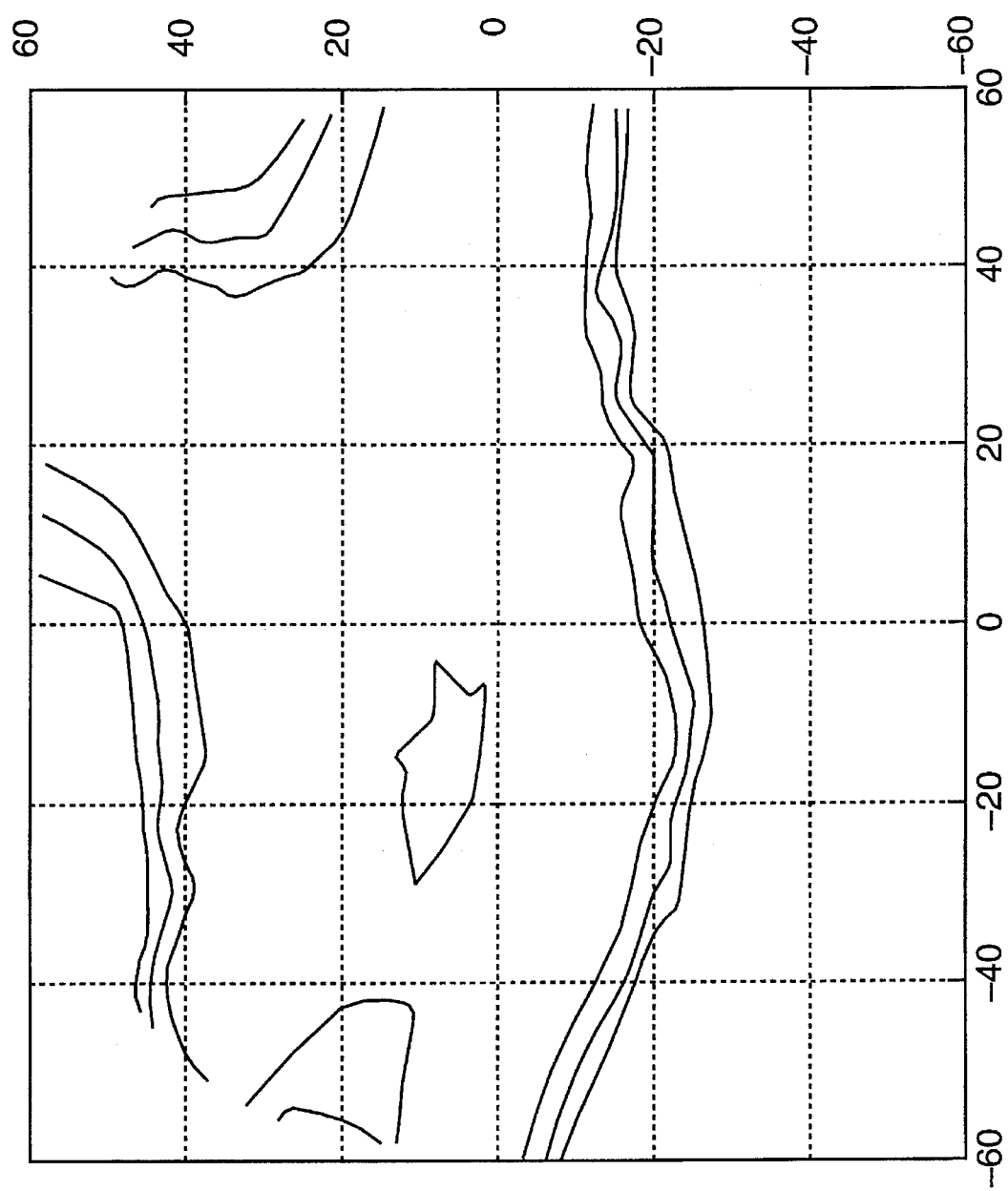
FIG. 15 is a plot as a function of vertical and horizontal viewing angle depicting calculated isocontrast contours for the compensator configuration depicted in FIG. 12.
Figure 16:
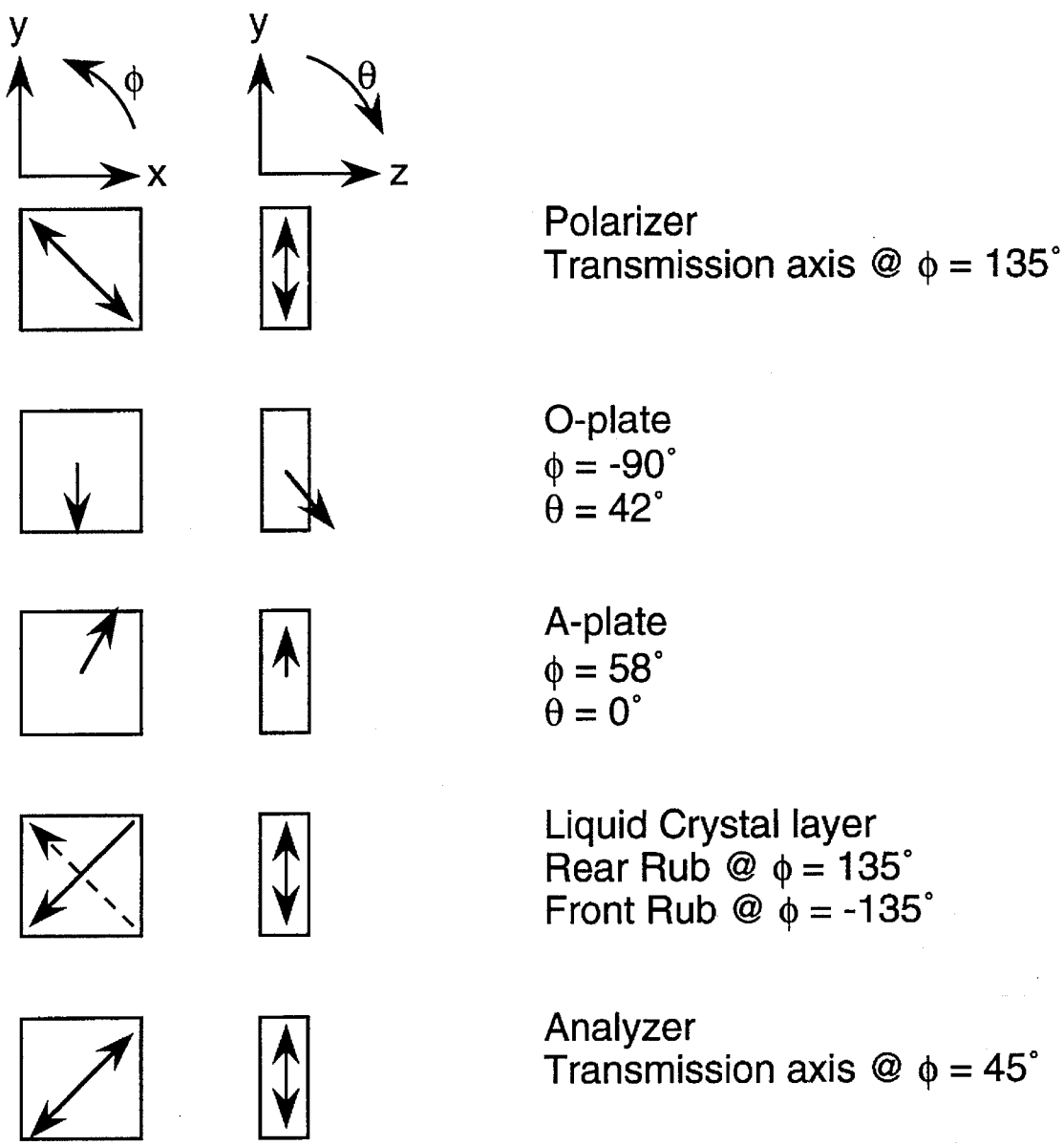
FIG. 16 is a schematic, expanded view of a gray scale compensator with an O-A-LC configuration constructed according to the present invention.
Figure 17:
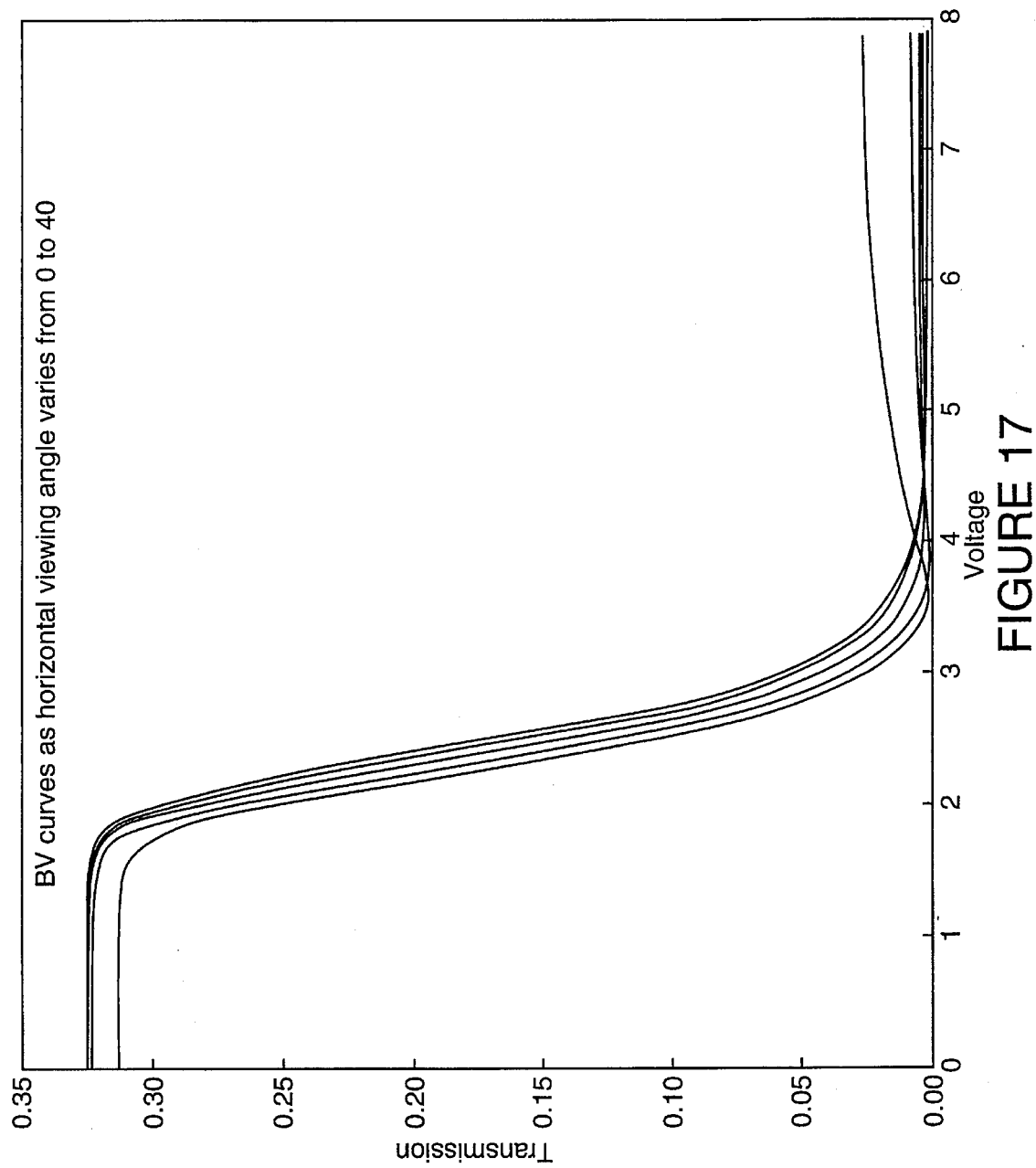
FIG. 17 is a plot of transmitted light as a function of voltage illustrating the BV characteristics at a variety of horizontal viewing angles for the compensator configuration depicted in FIG. 16.
Figure 18:
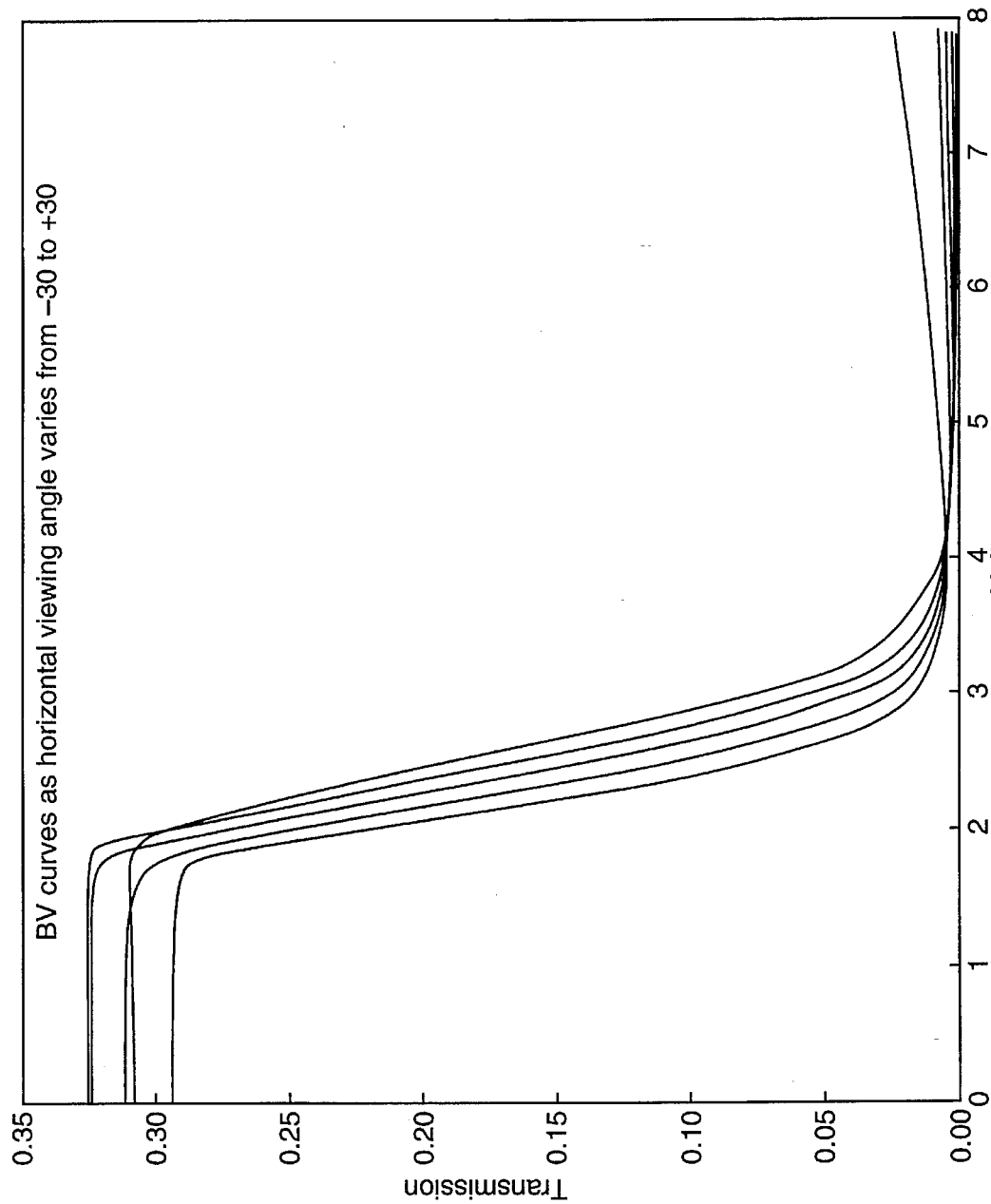
FIG. 18 is a plot of transmitted light as a function of voltage illustrating the BV characteristics at a variety of vertical viewing angles for the compensator configuration depicted in FIG. 16.
Figure 19:
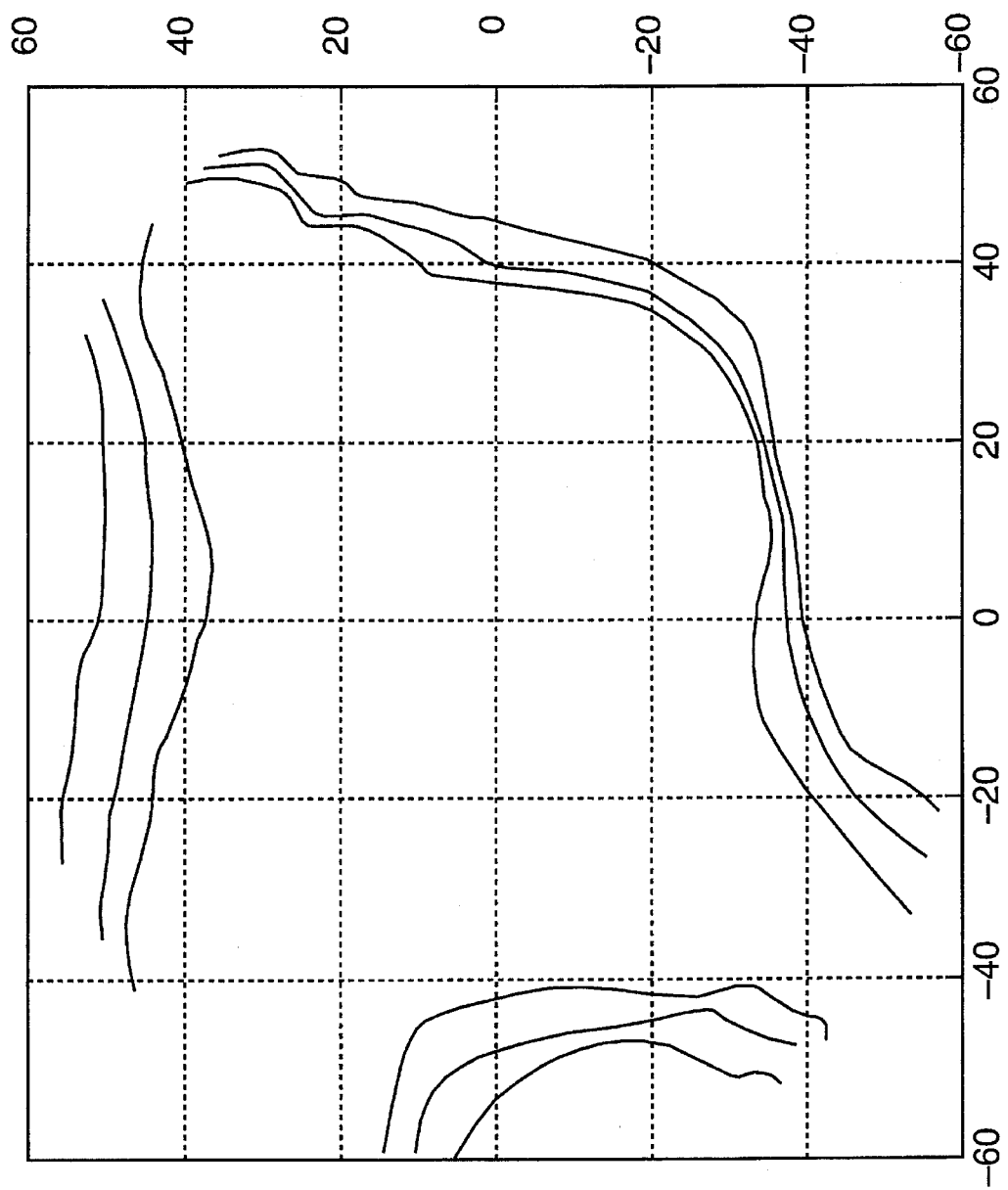
FIG. 19 is a plot as a function of vertical and horizontal viewing angle depicting calculated isocontrast contours for the compensator configuration depicted in FIG. 16.

For angles above normal, the curves shift to the left and develop a rebound after an initial minimum. These effects can be explained by considering the perspectives of viewers looking at the display from above, at, and below normal, as shown in FIG. 7. The critical feature is the relationship between the light traveling towards the viewer and the average liquid crystal director tilt at the center of the cell as voltage is increased.

As the voltage is increased the average liquid crystal director in the center of the cell tilts from a parallel orientation 702 toward a homeotropic one 704. For the viewer at normal incidence, retardation is highest at the nonselect state voltage and lowest at the select state voltage. When the anisotropy is zero, the polarization state of the light is unchanged and it is blocked by the analyzer. Thus the viewer sees a monotonic decrease in brightness to zero with increasing voltage. Now consider the case of the positive vertical viewing direction (viewer above normal incidence). At some intermediate voltage the average director 706 points toward the viewer and the retardation is minimal. Here the viewer sees a brightness with voltage that initially decreases, but then reaches a minimum at the point of minimal retardation and then increases.

For the negative vertical viewing direction (viewer below normal incidence) the average director always presents a large anisotropy to the light ray, even at the highest voltage. The viewer therefore secs a monotonic decrease in brightness. Furthermore, the average liquid crystal director is always oriented at a larger angle with respect to the light ray for the below normal viewer than it is for the normal incidence viewer. Therefore the anisotropy is greater and the brightness level is always higher in the negative vertical viewing direction than it is at normal incidence.

This dependency of the BV curves on vertical angle has a profound impact on gray scale linearity. Note that a voltage chosen to yield a 50 percent gray level on the 0 degree curve in FIG. 6 yields a dark state on the +30 degree curve and a fully white state at −30 degrees.

To eliminate reversal of gray levels and improve gray scale stability, it is an outstanding feature of this invention to provide a compensator which includes a birefringent O-plate compensator layer. The O-plate compensator of this invention utilizes a positive birefringent material with its principal optic axis oriented at a substantially oblique angle with respect to the plane of the display (hence the term "O-plate"). "Substantially oblique" implies an angle appreciably greater than 0° and less than 90°. O-plates have been utilized, for example, with angles relative to the plane of the display between 35° and 55°, typically at 45°. Moreover, O-plates with either uniaxial or biaxial materials can be used. The O-plate of this invention can be placed in a variety of locations between the polarizer layer and the analyzer layer.

The gray scale compensator of this invention may also include, in more particular embodiments, A-plates and/or negative C-plates. An A-plate is a birefringent layer with its extraordinary axis (i.e., its c-axis) oriented parallel to the surface of the layer. Its A-axis is thus oriented normal to the surface (parallel to the direction of normally incident light), leading to its designation as an A-plate. A-plates may be fabricated by the use of uniaxially stretched polymer films, such as polyvinyl alcohol, or other suitably oriented organic birefringent materials. A C-plate is a uniaxial birefringent layer with its extraordinary axis oriented perpendicular to the surface of the layer (parallel to the direction of normally incident light). Negatively birefringent C-plates may be fabricated by the use of uniaxially compressed polymers (See, e.g., Clerc, U.S. Pat. No. 4,701,028), stretched polymer films, or by the use of physical vapor deposited inorganic thin films (See, e.g., Yeh, U.S. Pat. No. 5,196,953), for example.

Oblique deposition of a thin film by physical vapor deposition (see, e.g., Motohiro, Applied Optics, Volume 28, Pages 2466–2482 (1989)), can be used to fabricate O-plate components. Such components are by their nature biaxial. The growth characteristics generate a microscopic columnar structure. The angles of the columns are tipped in the direction of the arrival of the vapor stream. A deposition angle (measured from normal) of 76°, for example, results in a column angle of approximately 45°. The columns develop an elliptical cross section as the result of shadowing. This elliptical cross section is what gives rise to the biaxial character of the films. The birefringence, in magnitude and symmetry, is entirely attributable to the film microstructure and is referred to as form birefringence. These phenomena in thin films have been extensively studied and described by Macleod, Structure-related Optical Properties of Thin Films, J. Vac. Sci. Technol. A, Volume 4, No. 3, Pages 418–422 (1986).

Uniaxial O-plate components similarly offer numerous solutions which in general have superior performance. These may be fabricated by the use of suitably oriented organic birefringent materials. Those skilled in the art will recognize other means for fabricating both uniaxial and biaxial O-plates.

The O-plate in the compensator of this invention is oriented with its principal symmetry axis at a substantially oblique angle with respect to the normal. In a particular embodiment, this orientation angle is nominally equal to the orientation of the average liquid crystal director in the central region of the liquid crystal layer at a voltage in the gray scale transition region of the BV curve. Furthermore, in a particular embodiment the azimuthal orientation of the principal symmetry axis is rotated with respect to that of the liquid crystal director by nominally 180°. The O-plate axis in this embodiment is thus oriented approximately perpendicular to the average liquid crystal director in the center of the cell. The compensator may be further configured such that it introduces no retardation for light traversing the cell at normal incidence. This is accomplished by combining the O-plate with a positively birefringent A-plate, with their optic axes nominally at right angles. Their retardations and relative angles are selected to cancel their retardation at normal incidence.

Elimination of gray scale reversal by the use of this gray scale compensation layer occurs in the following manner. In the positive vertical viewing direction, the retardation of the O-plate increases with viewing angle and tends to offset the decreasing retardation of the liquid crystal layer. When the viewer is looking down the axis of the average liquid crystal director, the presence of the O-plate prevents the layers between the two polarizers from appearing isotropic. Thus the rebound in the BV curve, shown in FIG. 6, is reduced and moved to higher voltages outside of the gray scale voltage range.

In the negative vertical viewing direction, the combination of an O-plate and an A-plate with their optic axes nominally at right angles tends to exhibit birefringence characteristics similar to that of a negative birefringence retarder with its optic axis oriented perpendicular to the plane containing the axes of the O-plate and A-plate. The direction of this retarder axis is nominally parallel to the orientation of the average liquid crystal in the central region of the cell when it is driven at a voltage between select and nonselect states. The presence of an O-plate oriented in this manner thus tends to cancel the birefringence of the liquid crystal layer, pulling the BV curve down, or equivalently, moving it toward the direction of lower voltages (i.e., left). A similar effect occurs in the positive and negative horizontal viewing directions as well.

The overall effect of introducing the O-plate compensator of this invention in this manner is to eliminate large rebounds in the gray scale voltage region and reduce the left-to-right shift in the BV curves as the viewing angle is varied from negative to positive vertical angles. The orientations of the compensator optic axes are carefully chosen so that the combined retardation effects cancel each other in the normal incidence viewing direction as well as minimize rebounds in the horizontal viewing direction. Combinations of more than one O-plate can be used as long as their orientations satisfy these requirements. Furthermore, negative C-plates can, for certain configurations, increase the contrast ratio at large fields of view, occasionally with some decrease in gray scale linearity.

The liquid crystal layer, the compensator layers, and the polarizer and analyzer layers may assume a variety of orientations relative to one another in implementing embodiments of the invention using oblique retarders. Some of the possible configurations which have been considered are set out in Table I, where A represents an A-plate, C represents a C-plate, O represents an O-plate, LC represents the liquid crystal, and OxO represents crossed O-plates. Crossed O-plates are adjacent O-plates with their azimuth angles Φ (as defined in FIG. 1) nominally crossed, one oriented between 0° and 90°; and the second oriented between 90° and 180°.

TABLE I

| ← Rear (Source Side) | | | | Front (Viewer Side) → | | |
|---|---|---|---|---|---|---|
| C | A | O | LC | O | A | C |
|   |   | O | A | LC |   |   |
|   | A | O | LC |   |   |   |
|   |   | O | LC | O | A |   |
| A | O | A | LC |   |   |   |
|   | O | A | LC | A |   |   |
| O | A | C | LC |   |   |   |
|   | OxO |   | A | LC |   |   |
| A | OxO |   | A | LC |   |   |
|   |   | A | LC | OxO | A |   |
| A | O | A | C | LC |   |   |
|   |   | A | O | LC | O | A |
|   | A | O | C | LC | C | O |
|   | A | O | C | LC | C | O | A |

The projections of the principal axes onto the plane of the display with respect to the liquid crystal director can vary with the embodiment. In some cases, for example with two O-plates, the O-plate axis projections are at 45° with respect to the average liquid crystal director, while in others, the O-plate axis is parallel with the liquid crystal director.

OxO (crossed O-plate) designs that are further compensated with A-plates provide additional design flexibility. The choice of A-plate value is not critical as such designs can be adjusted by varying the relative orientations of the A-plates. Thus it is possible to generate desired solutions with commercially available A-plate retardation values.

FIGS. 8–19 illustrate several possible gray scale compensation configurations according to this invention, including symmetric, asymmetric, and crossed O-plate configurations. These figures show, for each embodiment, the component configuration, the BV characteristics for both vertical and horizontal viewing angles, and calculated isocontrast curves. FIGS. 8–11 show an asymmetric configuration with an A-plate, O-plate, and C-plate on one side of the liquid crystal layer, and a C-plate and O-plate on the opposite side (A-O-C-LC-C-O). FIGS. 12–15 show a configuration using crossed O-plates on one side of the liquid crystal layer (A-OxO-A-LC). Finally, FIGS. 16–19 show a simple configuration with only two compensator components, one O-plate and one A-plate on one side of the liquid crystal layer (O-A-LC).

The flexibility which the oblique compensation scheme of this invention offers the display designer allows tailoring of performance to specific display product requirements. It is possible, for example, with simple configuration and parameter modifications to achieve isocontrast optimized for left or right viewing, isocontrast optimized for extreme vertical angle viewing, or isocontrast optimized for viewing at both large left and right angles above normal viewing. It is also possible to adjust the configuration and parameters to improve both field of view and grayscale linearity, or to further optimize one at the expense of the other. Furthermore, a negatively birefringent A-plate may be substituted for a positive A plate. In this case, the negatively birefringent A-plate would be oriented with its extraordinary axis perpendicular to the orientation appropriate for a positively birefringent A-plate. Additional changes would also be required in the other components of the compensator to optimize performance when a negative A-plate is used.

The preferred embodiments of this invention have been illustrated and described above. Modifications and additional embodiments, however, will undoubtedly be apparent to those skilled in the art. Another possible embodiment, for example, would utilize the compensator layers as one or more of the substrates in the display structure. Furthermore, this invention is applicable to liquid crystal displays other than 90° twisted nematic, as long as gray scale is achieved through a tilted director configuration. The invention is applicable as well to color displays, in which color filters are associated with the arrays of electrodes in the display. Furthermore, equivalent elements may be substituted for those illustrated and described herein, parts or connections might be reversed or otherwise interchanged, and certain features of the invention may be utilized independently of other features. In addition, details of the liquid crystal display, such as active matrix circuitry, are not presented because such details are well known in the art of liquid crystal displays. Consequently, the exemplary embodiments should be considered illustrative, rather than inclusive, while the appended claims are more indicative of the full scope of the invention.

The teaching of the following documents, which are referred to herein, is incorporated by reference:

Clerc, U.S. Pat. No. 4,701,028

Clerc, Vertically Aligned Liquid-Crystal Displays, SID 91 Digest, Pages 758–761 (Society for Information Display 1991);

Gooch, et al., The Optical Properties of Twisted Nematic Liquid Crystal Structures with Twist Angles <90°, Journal of Physics D, Volume 8, Page 1575 (1975);

Hatoh, et al., Viewing Angle Magnification in a TN LCD with an Ultra-Super-Twisted Liquid Crystal Compensator;

Iieda, et al., Color Compensation Plate for Liquid-Crystal Display, Japan Kokai Tokkyo Koho No. JP 03028822 A2 (7 Feb. 1991);

Kahn, The Molecular Physics of Liquid-Crystal Devices, Physics Today, Page 68 (May 1982);

Macleod, Structure-related Optical Properties of Thin Films, J. Vac. Sci. Technol. A, Volume 4, No. 3, Pages 418–422 (1986);

Motohiro, et al., Thin Film Retardation Plate by Oblique Deposition, Appl. Opt., vol. 28, No. 13, Pages 2466–2482 (1989);

Yamamoto, et al., Full-Cone Wide-Viewing-Angle Multicolor CSH-LCD, SID 91 Digest, Pages 762–765 (Society for Information Display 1991); and Yeh, et al., "Compensator for Liquid Crystal Display", U.S. Pat. No. 5,196,953.

We claim:

1. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including a positively birefringent O-plate compensator layer disposed between the polarizer layer and the analyzer layer with its principal symmetry axis oriented at a substantially oblique angle of between 25 and 65 degrees with respect to the normal axis.

2. The liquid crystal display of claim 1, wherein the principal symmetry axis of the O-plate layer is further oriented approximately perpendicular to the orientation of the average liquid crystal director in the central region of the liquid crystal layer at a voltage in the gray scale transition region of the BV curve for the liquid crystal layer.

3. The liquid crystal display of claim 1, wherein the principal symmetry axis of the O-plate layer is further oriented at an angle with respect to the normal axis that is approximately equal to the orientation angle with respect to the normal axis of the average liquid crystal director in the central region of the liquid crystal layer at a voltage in the gray scale transition region of the BV curve for the liquid crystal layer and wherein the azimuthal orientation of the principal symmetry axis of the O-plate layer about the normal axis is rotated approximately 180° with respect to the azimuthal orientation of the average liquid crystal director.

4. The liquid crystal display of claim 1, wherein the compensator further comprises a positively birefringent A-plate compensator layer disposed between the polarizer layer and the analyzer layer, the A-plate layer being oriented with its optic axis relative to the optic axis of the O-plate layer such that retardation of light passing through the compensator at normal incidence is minimized.

5. The liquid crystal display of claim 1, wherein the compensator further comprises a negatively birefringent C-plate compensator layer disposed between the polarizer layer and the analyzer layer.

6. The liquid crystal display of claim 1, wherein:

the O-plate layer further comprises a first positively birefringent O-plate compensator layer; and wherein the compensator further comprises:

a second positively birefringent O-plate compensator layer disposed between the polarizer layer and the analyzer layer with its optic axis oriented at a substantially oblique angle with respect to the normal axis and such that the azimuth angles of the first and second O-plate layers are crossed.

7. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including:

a positively birefringent O-plate compensator layer disposed between the polarizer layer and the analyzer layer with its optic axis oriented at a substantially oblique angle of between 25 and 65 degrees with respect to the normal axis; and a positively birefringent A-plate compensator layer disposed between the liquid crystal layer and the O-plate layer, the A-plate layer being oriented with its optic axis relative to the optic axis of the O-plate layer such that retardation of light passing through the compensator at normal incidence is minimized.

8. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including:

a positively birefringent O-plate compensator layer disposed between the polarizer layer and the liquid crystal layer with its optic axis oriented at a substantially oblique angle of between 25 and 65 degrees with respect to the normal axis;

a first positively birefringent A-plate compensator layer disposed between the polarizer layer and the O-plate layer; and a second positively birefringent A-plate compensator layer disposed between the O-plate layer and the liquid crystal layer, the first and second A-plate layers being oriented with their optic axes relative to the optic axis of the O-plate layer such that retardation of light passing through the compensator at normal incidence is minimized.

9. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including:

a positively birefringent O-plate compensator layer disposed between the polarizer layer and the liquid crystal layer with its optic axis oriented at a substantially oblique angle of between 25 and 65 degrees with respect to the normal axis;

a first positively birefringent A-plate compensator layer disposed between the O-plate layer and the liquid crystal layer; and a second positively birefringent A-plate compensator layer disposed between the liquid crystal layer and the analyzer layer, the first and second A-plate layers being oriented with their optic axes relative to the optic axis of the O-plate layer such that retardation of light passing through the compensator at normal incidence is minimized.

10. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including:

a positively birefringent O-plate compensator layer disposed between the polarizer layer and the liquid crystal layer with its optic axis oriented at a substantially oblique angle with respect to the normal axis;

a positively birefringent A-plate compensator layer disposed between the O-plate layer and the liquid crystal layer, the A-plate layer being oriented with its optic axis relative to the optic axis of the O-plate layer such that retardation of light passing through the compensator at normal incidence is minimized; and a negatively birefringent C-plate compensator layer disposed between the A-plate layer and the liquid crystal layer.

11. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including:

a first positively birefringent O-plate compensator layer disposed between the polarizer layer and the liquid crystal layer with its optic axis oriented at a substantially oblique angle with respect to the normal axis;

a second positively birefringent O-plate compensator layer disposed between the first O-plate layer and the liquid crystal layer, with its optical axis oriented at a substantially oblique angle with respect to the normal axis and such that the azimuth angles of the first and second O-plate layers are crossed;

a first positively birefringent A-plate compensator layer disposed between the polarizer layer and the first O-plate layer; and a second positively birefringent A-plate compensator layer disposed between the second O-plate layer and the liquid crystal layer, the first and second A-plate layers being oriented with their optic axes relative to the optic axis of the O-plate compensator layer such that retardation of light passing through the compensator at normal incidence is minimized.

12. A liquid crystal display for viewing at various angles with respect to a normal axis perpendicular to the display, comprising:

a polarizer layer having an absorbing axis;

an analyzer layer having an absorbing axis substantially perpendicular to the absorbing axis of the polarizer layer;

a liquid crystal layer disposed between the polarizer layer and the analyzer layer and having a director exhibiting an azimuthal twist through the layer with respect to the normal axis;

a first electrode proximate to a first major surface of the liquid crystal layer;

a second electrode proximate to a second major surface of the liquid crystal layer, the first and second electrodes being adapted to apply a voltage across the liquid crystal layer when the electrodes are connected to a source of electrical potential; and a compensator, including:

a first positively birefringent O-plate compensator layer disposed between the polarizer layer and the liquid crystal layer with its optic axis oriented at a substantially oblique angle with respect to the normal axis;

a second positively birefringent O-plate compensator layer disposed between the liquid crystal layer and the analyzer layer with its optic axis oriented at a substantially oblique angle with respect to the normal axis;

a positively birefringent A-plate compensator layer disposed between the polarizer layer and the first O-plate layer, the A-plate layer being oriented with its optic axis relative to the optic axis of the first O-plate layer such that retardation of light passing through the compensator at normal incidence is minimized; and a first negatively birefringent C-plate compensator layer disposed between the first O-plate layer and the liquid crystal layer; and a second negatively birefringent C-plate compensator layer disposed between the liquid crystal layer and the second O-plate layer.

* * * * *